United States Patent
Sasagawa et al.

(10) Patent No.: US 9,127,372 B2
(45) Date of Patent: Sep. 8, 2015

(54) PRESSURE VESSEL FOR GROWING SINGLE CRYSTALS

(75) Inventors: Yuji Sasagawa, Hokkaido (JP); Osamu Wakao, Hokkaido (JP); Yoshihiko Yamamura, Hokkaido (JP); Shigeharu Akatsuka, Tokyo (JP); Keiichiro Matsushita, Ibaraki (JP)

(73) Assignees: THE JAPAN STEEL WORKS, LTD., Tokyo (JP); MITSUBISHI CHEMICAL CORPORATION, Tokyo (JP); FURUYA METAL CO., LTD., Tokyo (JP)

(*) Notice: Subject to any disclaimer, the term of this patent is extended or adjusted under 35 U.S.C. 154(b) by 1319 days.

(21) Appl. No.: 11/813,805

(22) PCT Filed: Jan. 11, 2006

(86) PCT No.: PCT/JP2006/300207
§ 371 (c)(1),
(2), (4) Date: Jul. 12, 2007

(87) PCT Pub. No.: WO2006/075613
PCT Pub. Date: Jul. 20, 2006

(65) Prior Publication Data
US 2009/0013926 A1   Jan. 15, 2009

(30) Foreign Application Priority Data

Jan. 12, 2005 (JP) ................................. 2005-004998

(51) Int. Cl.
*C30B 35/00* (2006.01)
*C30B 7/10* (2006.01)

(52) U.S. Cl.
CPC ................. *C30B 7/10* (2013.01); *C30B 35/002* (2013.01); *Y10T 117/10* (2015.01); *Y10T 117/1096* (2015.01)

(58) Field of Classification Search
CPC .. C30B 7/10; C30B 35/002; Y10T 117/1096; Y10T 117/10
USPC .............. 117/222, 224, 900, 71, 72, 200–220
See application file for complete search history.

(56) References Cited

U.S. PATENT DOCUMENTS 2,745,713 A * 5/1956 Suits .............................. 423/659
3,650,823 A * 3/1972 Mead et al. .................... 438/557
(Continued)

FOREIGN PATENT DOCUMENTS

JP         62107004 A *   5/1987 ................ B22F 3/14
JP         7-22692 B2     3/1995
(Continued)

OTHER PUBLICATIONS

Extended European Search Report dated Aug. 5, 2009.
(Continued)

*Primary Examiner* — Matthew Song
(74) *Attorney, Agent, or Firm* — Sughrue Mion, PLLC

(57) ABSTRACT

An object of the present invention is to manufacture single crystals of high quality on an industrial production scale by preventing impurities from being mixed in single crystals when the single crystals are produced by the solvothermal method.

A pressure vessel body 1, in which a supercritical state is maintained, is made of heat resistant alloy, a portion of the pressure vessel body is open, a corrosion-resistant mechanical lining 5 is provided on an inner face of the pressure vessel and on an entire outer circumferential edge of the opening, and the opening is sealed by an airtight mating face formed out of a corrosion-resistant mechanical lining, which is formed on the outer circumferential edge of the opening, and by an airtight mating face of the corrosion-resistant mechanical lining cover 6 on an inner face of the cover 3 through a corrosion-resistant gasket member. Since the pressure vessel body and the inner face of the cover are covered with the corrosion-resistant mechanical lining, corrosion can be prevented. The corrosion-resistant mechanical lining ensures the sealing property on the airtight mating face between the pressure vessel body and the cover and further effectively prevents corrosion in the airtight sealing portion and it becomes possible to repeatedly open and close the airtight sealing portion.

20 Claims, 10 Drawing Sheets

(56) References Cited

U.S. PATENT DOCUMENTS

| | | | |
|---|---|---|---|
| 3,913,212 A * | 10/1975 | Bachmann et al. | 438/22 |
| 4,300,979 A | 11/1981 | Kolb et al. | |
| 4,382,840 A * | 5/1983 | Chai et al. | 117/71 |
| 4,406,855 A * | 9/1983 | Schwiers et al. | 376/250 |
| 4,424,391 A * | 1/1984 | Walraevens et al. | 549/525 |
| 4,481,069 A * | 11/1984 | Chai et al. | 117/71 |
| 4,708,764 A * | 11/1987 | Boden et al. | 117/15 |
| 4,961,823 A * | 10/1990 | Hirano et al. | 117/71 |
| 5,456,204 A | 10/1995 | Dimitrov et al. | |
| 5,533,465 A | 7/1996 | Ferretti et al. | |
| 5,902,396 A * | 5/1999 | Purdy | 117/71 |
| 6,177,057 B1 * | 1/2001 | Purdy | 423/409 |
| 6,254,677 B1 * | 7/2001 | Hashio et al. | 117/206 |
| 6,861,144 B2 * | 3/2005 | Wakamatsu et al. | 428/402 |
| 7,063,741 B2 * | 6/2006 | D'Evelyn et al. | 117/73 |
| 7,101,433 B2 * | 9/2006 | D'Evelyn et al. | 117/69 |
| 7,125,453 B2 * | 10/2006 | D'Evelyn et al. | 117/200 |
| 2002/0017235 A1 * | 2/2002 | Nagasaka et al. | 117/106 |
| 2003/0127337 A1 * | 7/2003 | Hanson et al. | 205/96 |
| 2003/0140845 A1 * | 7/2003 | D'Evelyn et al. | 117/8 |
| 2003/0141301 A1 * | 7/2003 | D'Evelyn et al. | 220/62.11 |
| 2003/0183155 A1 * | 10/2003 | D'Evelyn et al. | 117/68 |
| 2004/0108319 A1 * | 6/2004 | Bettinger | 220/651 |
| 2005/0109062 A1 * | 5/2005 | Stelle et al. | 65/32.1 |
| 2006/0022596 A1 * | 2/2006 | Watanabe et al. | 313/623 |
| 2008/0174641 A1 * | 7/2008 | Ogawa et al. | 347/71 |
| 2009/0013926 A1 * | 1/2009 | Sasagawa et al. | 117/224 |

FOREIGN PATENT DOCUMENTS

| | | |
|---|---|---|
| JP | 2001-170478 A | 6/2001 |
| JP | 2002-102671 A | 4/2002 |
| JP | 2002-361069 A | 12/2002 |
| JP | 2003-63889 A | 3/2003 |
| JP | 2003-165794 A | 6/2003 |
| JP | 2003-176197 A | 6/2003 |
| JP | 2003-227182 A | 10/2003 |

OTHER PUBLICATIONS

W Beitz, K.H. Grote "Dubbel-Taschenbuch fur den Maschinenbau" Springer, Berlin, 1997. XP002533605. p. 10-24.

* cited by examiner

PRESSURE VESSEL FOR GROWING SINGLE CRYSTALS

TECHNICAL FIELD

The present invention relates to a pressure vessel used for manufacturing single crystals of high purity made of zinc oxide, gallium nitride and so forth by solvothermal method represented by hydrothermal synthesis method and ammonothermal synthesis method.

BACKGROUND ART

An example of related pressure vessel used for manufacturing single crystals is shown in FIG. 9.

Seed crystals 10, raw material 11, a convection control plate 9 and solvent are accommodated in a cylindrical pressure vessel 30. One end of the pressure vessel body 30 is open. Through a ring-shaped self-contraction gasket 32 arranged in a periphery of the opening, a cover 33 is fixed by a box nut or a clamp 34, so that the opening can be closed. On an inner face of the cover 33, a lining cover 35 is provided. In the periphery of the pressure vessel body 30, a heater 4 is arranged so that the pressure vessel body 30 can be heated.

When the hydrothermal synthesis method is taken up as an example, single crystals to be synthesized are artificial quartz (silicon dioxide) or zinc oxide. A strong base aqueous solution is used as a solvent. In a case of ammono-thermal synthesis method, as proposed in Patent Document 1, single crystals to be synthesized are made of gallium nitride, and liquefied ammonia is used as a solvent.

Single crystals to be manufactured are used for various optical and electronic elements. A main factor which has influence on a quality of single crystals is contamination of foreign objects caused at the time of growth of crystals. Since a solvent made of an alkali aqueous solution is corrosive, the pressure vessel body 30 and the cover 33 are corroded and ions of iron and nickel are eluted. These metallic ions are changed into chemical compounds such as oxide or nitride and mixed into the crystals in the form of foreign objects. Accordingly, it is difficult to manufacture single crystals of high purity.

As a countermeasure of solving the above problems, for example, Patent Document 2 proposes the following method. As shown in FIG. 9, a cylindrical mechanical lining 31 made of alloy having high corrosion resistance property is provided tightly close to an inner face of the pressure vessel body 30 so as to cover the inner face of the pressure vessel with the mechanical lining 31. Incidentally, the method of covering the inner face of the pressure vessel with corrosion-resistant material is proposed in Patent Documents 3 and 4 in which the inside of a reaction container used for supercritical water is covered with the mechanical lining.

Except for the above method, the following method is proposed. As shown in FIG. 10, an internal cylindrical container 37 made of corrosion-resistant alloy is accommodated in the pressure vessel body 30. This technique is disclosed, for example, in Patent Documents 5, 6 and 7.

The internal cylindrical container 37 is separate from the pressure vessel body 30. At least an inner face of the internal cylindrical container 37 is made of precious metal such as Pt having high corrosion resistance property so that foreign objects can be prevented from being mixed into single crystals. When this method of using the internal cylindrical container 37 is employed, since the internal cylindrical container 37 is liable to break when a pressure difference is given between the inside and the outside of the internal cylindrical container 37, it is necessary to apply a technique of making the pressure difference, which is given between the inside and the outside of the internal cylindrical container 37, to be uniform. Accordingly, in this method, a pressure regulator 38 is attached. Patent Document 8 proposes an internal cylindrical container 37 which is made of material capable of being easily plastically deformed and sealed by means of cold welding.

Patent Document 1: JP-A-2003-277182
Patent Document 2: JP-A-2003-165794
Patent Document 3: JP-A-2001-170478
Patent Document 4: JP-A-2002-361069
Patent Document 5: JP-B-7-22692
Patent Document 6: JP-A-2003-63889
Patent Document 7: JP-A-2003-176197
Patent Document 8: US 2003/0141301 A1

DISCLOSURE OF THE INVENTION

Problems that the Invention is to Solve

As described above, in the related pressure vessel for manufacturing single crystals, in order to prevent foreign objects from being mixed into the single crystals, a method of covering the inner face of the pressure vessel with corrosion-resistant material is proposed, and a method of using the internal cylindrical container made of corrosion-resistant material is also proposed.

However, when the method of covering the inner face of the pressure vessel with corrosion resistant material is employed, a problem is caused in the method of covering the pressure vessel body and covering the airtightly sealing portion of the cover. In the case of a pressure vessel in which single crystals are manufactured on an industrial production scale, the airtightly sealing portion should be used being repeatedly opened and closed. According to the related art, even when the airtightly sealing portion is covered, the covering is deformed or peeled. Alternatively, the covering adheres to each other. Due to the above problems, the covered airtightly sealing portion can not be repeatedly opened and closed. Therefore, it is impossible to avoid the occurrence of a problem in which foreign objects are mixed into the airtightly sealing portion.

In the case where a strong base aqueous solution, a strong acid aqueous solution or liquefied ammonia having high corrosion property is used as a solvent, especially since liquefied ammonia is very corrosive at high temperature and pressure, not only the pressure vessel is corroded but also the pressure vessel is damaged by nitriding or an attack of hydrogen, which may cause a serious accident such as destruction of the pressure vessel. Although a mineralization agent added to the solvent is necessary for growing single crystals, it is very corrosive. Therefore, in order to protect the pressure vessel from corrosion, it is indispensable to cover the pressure vessel with corrosion-resistant material. Accordingly, it is important how to cover the airtightly sealing portion with the corrosion-resistant material.

In the method in which the internal cylindrical container made of corrosion-resistant material is used, in order to prevent destruction of the internal cylindrical container caused by a pressure difference between the inside and the outside of the internal cylindrical container, a pressure regulator is attached. However, in the case of a large container used for production on an industrial scale, it is impossible for a related pressure regulator to provide a sufficient advantage and the solvent flows from the outside of the internal cylindrical container into the inside. Therefore, foreign objects can not be sufficiently prevented from being mixed into single crystals. In the case of an internal cylindrical container which is made of material easily plastically deformed and sealed by means of cold welding, the internal cylindrical container can not be appropriately applied to a middle-scale or a large-scale pressure vessel used for industrially producing single crystals.

The present invention has been accomplished to solve the above problems. An object of the present invention is to provide a pressure vessel capable of manufacturing single crystals of high quality on an industrial production scale by preventing impurities from being mixed in single crystals when the single crystals are produced by the solvothermal method.

Means for Solving the Problems

The present invention provides a pressure vessel for growing single crystals by the solvothermal method in which solvent such as a strongly corrosive alkali aqueous solution or a supercritical fluid of ammonia is used, the pressure vessel including a pressure vessel body made of a heat resistant alloy for maintaining a supercritical state, the pressure body including an opening, a corrosion-resistant mechanical lining provided on an inner face of the pressure vessel and on an entire outer circumferential edge of the opening, and a cover for sealing the opening under the condition that the corrosion-resistant mechanical lining formed on the outer circumferential edge of the opening is used as an airtight mating face.

The present invention provides a pressure vessel for growing single crystals, wherein the pressure vessel body is made of one of the heat-resistant alloys of Fe alloy, Ni alloy, Cr alloy, Mo alloy and Co alloy.

The present invention provides a pressure vessel for growing single crystals, wherein the corrosion-resistant mechanical lining is made of Pt or Ir, alloy in which at least one of Ir, Rh, Au, Ru, Re and $ZrO_2$ is added into Pt, alloy in which at least one of Pt, Rh, Ru and Re is added to Ir, alloy in which at least one of Pt, Au, Ir, Ru and Re is added into Rh, or a combination thereof.

The present invention provides a pressure vessel for growing single crystals, wherein coefficients of linear expansion of the heat-resistant alloy and the corrosion resistant mechanical lining in the temperature region from the room temperature to 550° C. are in the range from $5\times10^{-6}$ to $11\times10^{-6}$, and wherein the coefficients of linear expansion of the heat-resistant alloy and the corrosion resistant mechanical lining in the temperature region from the room temperature to 550° C. are substantially the same with each other.

The present invention provides a pressure vessel for growing single crystals, wherein an intermediate covering layer, the corrosion-resistant property and the nitriding-resistant property of which are high, is formed as an inner layer of the corrosion-resistant mechanical lining on an inner face of the pressure vessel body by the wall thickness in the range from 1 to 30 mm.

The present invention provides a pressure vessel for growing single crystals, wherein the intermediate coating layer is made of corrosion-resistant alloy of one of Fe alloy, Ni alloy, Cr alloy, Mo alloy and Co alloy.

The present invention provides a pressure vessel for growing single crystals, wherein the corrosion-resistant mechanical lining is composed by joining the corrosion-resistant mechanical lining formed on the outer circumferential edge of the opening and the corrosion-resistant mechanical lining formed on the inner face of the pressure vessel body.

The present invention provides a pressure vessel for growing single crystals, wherein the corrosion-resistant mechanical lining is composed by joining the corrosion-resistant mechanical lining formed on the outer circumferential edge of the opening and the corrosion-resistant mechanical lining formed on the inner face of the pressure vessel body, wherein the corrosion-resistant mechanical lining formed on the outer circumferential edge of the opening is made of Pt or Ir, alloy in which at least one of Ir, Rh, Au, Ru, Re and $ZrO_2$ is added into Pt, alloy in which at least one of Pt, Rh, Ru and Re is added to Ir, or alloy in which at least one of Pt, Au, Ir, Ru and Re is added into Rh, and wherein the corrosion-resistant mechanical lining formed on the inner face of the pressure vessel is made of Pt or Ir, alloy in which at least one of Ir, Rh, Au, Ru, Re and $ZrO_2$ is added into Pt, alloy in which at least one of Pt, Rh, Ru and Re is added to Ir, or alloy in which at least one of Pt, Au, Ir, Ru and Re is added into Rh.

The present invention provides a pressure vessel for growing single crystals, wherein the wall thickness of the corrosion-resistant mechanical lining formed on the outer circumferential edge of the opening is larger than that of the corrosion-resistant mechanical lining formed on the inner face of the pressure vessel body, and wherein a tapered portion, in which the wall thickness is changed, is provided in a joining portion of the corrosion-resistant mechanical lining formed on the outer circumferential edge of the opening and the corrosion-resistant mechanical lining formed on the inner face of the pressure vessel body or provided in a periphery on a bottom side of the joining portion.

The present invention provides a pressure vessel for growing single crystals, further including a gasket member interposed between the airtight mating face and the cover, wherein the corrosion-resistant mechanical lining composing the airtight mating face is made of a material harder than that of the gasket member.

The present invention provides a pressure vessel for growing single crystals, further including a self-contraction gasket member is interposed between the airtight mating face and the cover, wherein the self-contraction gasket member is made of Pt or Ir, alloy in which at least one of Ir, Rh, Au, Ru, Re and $ZrO_2$ is added into Pt, alloy in which at least one of Pt, Rh, Ru and Re is added to Ir, or alloy in which at least one of Pt, Ir, Au, Ru and Re is added into Rh, and wherein the self-contraction gasket member is made of a material different from a material composing the airtight mating face.

The present invention provides a pressure vessel for growing single crystals, wherein the airtight mating face and one or both of the surfaces of the gasket member are coated with a layer of material, which has high corrosion-resistance property and the 0.2% proof stress at temperature 550° C. of which is not less than 150 MPa, by the thickness 0.01 to 100 μm.

The present invention provides a pressure vessel for growing single crystals, wherein a material of the coating is one of Pt alloy, Ir, Ir alloy, Rh, Rh alloy, Au alloy, Ru, Ru alloy, Re, Ta, Ta alloy, Zr and Zr alloy.

The present invention provides a pressure vessel for growing single crystals, wherein the pressure vessel body includes a small hole for deflating gas staying between the pressure vessel body and the corrosion-resistant mechanical lining, and wherein the pressure vessel further includes a penetration preventing member arranged between the pressure vessel body and the corrosion-resistant lining.

The present invention provides a pressure vessel for growing single crystals, wherein one or both of the inner wall of the pressure vessel body and the outer wall of the corrosion-resistant mechanical lining are coated with highly ductile material, and wherein the coated highly ductile material is clad between members opposed to each other at high temperature and pressure.

The present invention provides a pressure vessel for growing single crystals, wherein the highly ductile material is made of Pt, Au, Ag, Cu or Ta.

The present invention provides a pressure vessel for growing single crystals, wherein the pressure vessel body includes a small hole capable of being opened and closed is provided in the pressure vessel body, and wherein the small hole includes a sensor for detecting a composition of gas staying in a gap between the pressure vessel body and the corrosion-resistant mechanical lining.

The present invention provides a pressure vessel for growing single crystals, wherein the pressure vessel includes an internal container, wherein solvent including alkali aqueous solution or ammonia fluid, to which a strongly corrosive mineralizing agent is added, is charged into the internal container, wherein solvent including water not containing the mineralizing agent, alkali aqueous solution or pure ammonia is charged into a gap formed between the outside of the internal container and the corrosion-resistant mechanical lining, and wherein the supercritical state is maintained in the internal container under the condition that a pressure inside the internal container and a pressure outside the internal container are balanced by heating.

The present invention provides a pressure vessel for growing single crystals, wherein the internal container is made of Pt or Ir, alloy in which at least one of Ir, Rh, Au, Ru, Re and $ZrO_2$ is added into Pt, alloy in which at least one of Pt, Rh, Ru and Re is added to Ir, or alloy in which at least one of Pt, Au, Ir, Ru and Re is added into Rh, or a combination thereof.

According to the present invention, the inner face of the pressure vessel body is covered with the mechanical lining having high corrosion-resistance property so that corrosion of the pressure vessel body caused by the reaction liquid can be prevented. Since the corrosion-resistant mechanical lining is provided on the entire outer circumferential edge of the pressure vessel body, the airtight mating face between the pressure vessel and the cover can be sealed. Further, the airtight sealing portion can be prevented from corrosion. Furthermore, even when the airtight sealing portion is repeatedly opened and closed, no problems are caused. The lining cover having high corrosion-resistant property can be provided on the inner face of the cover.

In the structure described above, there is no possibility that the pressure vessel comes into contact with solvent such as strongly corrosive ammonia. Therefore, the purity of single crystals can be highly enhanced. Further, the corrosion, the nitriding and the invasion of hydrogen into the inner wall of the pressure vessel and the airtight sealing portion, which come into contact with the supercritical fluid, can be effectively prevented.

The above pressure vessel body should be heat-resistant enough at the time of growing single crystals by the solvothermal method. For example, Fe alloy, Ni alloy, Cr alloy, Mo alloy and Co alloy are used for the pressure vessel body.

The corrosion-resistant mechanical lining is formed at high temperature and pressure being closely contacted with the pressure vessel body. The mechanical lining should be corrosion-resistant so that it can not be corroded by a reaction liquid. It is preferable that the corrosion-resistant mechanical lining is made of Pt or Ir, or alternatively the corrosion-resistant mechanical lining is made of alloy in which at least one of Ir, Rh, Au, Ru, Re and $ZrO_2$ is added into Pt, alloy in which at least one of Pt, Rh, Ru and Re is added to Ir, or alloy in which at least one of Pt, Au, Ir, Ru and Re is added into Rh, or alternatively the corrosion-resistant mechanical lining is made of a combination of the above alloys.

It is preferable that coefficients of linear expansion of the heat-resistant material composing the pressure vessel body and the corrosion-resistant material composing the corrosion resistant mechanical lining in the temperature region from the room temperature to 550° C. are in the range from $5 \times 10^{-6}$ to $11 \times 10^{-6}$, and the coefficients of linear expansion in the above temperature region are substantially the same with each other. Accordingly, it is possible to prevent the occurrence of damage of the lining caused by a difference in the heat expansion between both of them while they are being used at high temperature and pressure. Incidentally, it is preferable that the difference in the heat expansion between both of them is as small as possible. Specifically, it is preferable that the difference is not more than $3 \times 10^{-6}$.

On the inner face of the pressure vessel body, it is possible to provide an intermediate covering layer between the pressure vessel body and the corrosion-resistant mechanical lining. This intermediate covering layer can be made of padding metal. In the case where the corrosion-resistant mechanical lining is damaged and the strongly corrosive solvent flows outside the mechanical lining, this intermediate covering layer can prevent the pressure vessel from being corroded and damaged. When the intermediate covering layer is arranged, it is possible to use heat-resistant alloy, which has high mechanical strength at high temperature, irrespective of the corrosion-resistant property of the alloy. Wall thickness of the intermediate covering layer is 1 to 30 mm. When the wall thickness is smaller than 1 mm, it becomes difficult to sufficiently obtain the above action. In contrast, when the wall thickness exceeds 30 mm, internal residual stress is increased and economy of the cost is deteriorated. Therefore, the upper limit of the wall thickness is determined at 30 mm.

The above intermediate covering layer is made of material, the corrosion-resistance and the nitriding-resistance of which are high. For example, Fe alloy, Ni alloy, Cr alloy, Mo alloy and Co alloy are used.

The corrosion-resistant mechanical lining can be composed in such a manner that a corrosion-resistant mechanical lining formed on the inner face of the pressure vessel body and a corrosion-resistant mechanical lining formed on the outer circumferential edge of the opening portion of the pressure vessel are joined to each other by means of welding. In this case, the corrosion-resistant mechanical lining formed on the inner face of the pressure vessel body can be made of material, the corrosion-resistant property and ductility of which are high. The corrosion-resistant mechanical lining formed on the outer circumferential edge of the opening portion of the pressure vessel can be made of material, the corrosion-resistant property and the surface pressure strength of which are high.

When the ductility is enhanced, it is possible to prevent the occurrence of a break of the mechanical lining caused by a difference between the coefficient of linear expansion of the mechanical lining and that of the pressure vessel body. When the surface strength of the mechanical lining is enhanced and the mechanical lining is made of material which is difficult to be plastically deformed, the seat face is prevented from being deformed. Therefore, the airtight sealing portion can be repeatedly used.

In the case of joining both the pressure vessel body and the mechanical lining, in order to ensure the mechanical strength of the welded joint portion, it is desirable to give consideration to a shape of the welded joint portion and a welding position. Accordingly, it is possible to prevent stress concentration and a break of the welded joint portion caused by corrosion and fatigue.

From the viewpoint of selecting the material, it is preferable that the corrosion-resistant mechanical lining formed on the outer circumferential edge of the opening portion of the pressure vessel is made of Pt or Ir, or alternatively the corrosion-resistant mechanical lining is made of alloy in which at least one of Ir, Rh, Au, Ru, Re and $ZrO_2$ is added into Pt, alloy in which at least one of Pt, Rh, Ru and Re is added to Ir, or alloy in which at least one of Pt, Au, Ir, Ru and Re is added into Rh. It is preferable that the corrosion-resistant mechanical lining formed on the inner face of the pressure vessel body is made of Pt or Ir, or alternatively the corrosion-resistant mechanical lining is made of alloy in which at least one of Ir, Rh, Au, Ru, Re and $ZrO_2$ is added into Pt, alloy in which at least one of Pt, Rh, Ru and Re is added to Ir, or alloy in which at least one of Pt, Au, Ir, Ru and Re is added into Rh.

Between the corrosion-resistant mechanical lining formed on the outer circumferential edge of the opening portion of the pressure vessel and the cover, it is possible to arrange a gasket member for enhancing the sealing property. In this case, when the hardness of the corrosion-resistant mechanical lining is made to be higher than that of the gasket member, it is possible to prevent the airtight mating face from being deformed. Therefore, the airtight mating face can be repeatedly used, so that the durability can be enhanced. When the gasket member is periodically replaced, it is possible to repeatedly open and close the opening portion of the pressure vessel.

It is possible to arrange a self-contraction gasket member between the corrosion-resistant mechanical lining on the outer circumferential edge of the opening portion of the pressure vessel and the cover. The self-contraction gasket member is composed so that it can be strongly press-fitted into the gap when the self-contraction gasket member is given high temperature and pressure in the pressure vessel body. For example, the self-contraction gasket member can be formed into a tapered shape in which the wall thickness on the inner circumferential side is large.

The self-contraction gasket member is made of Pt or Ir, or alternatively the self-contraction gasket member is made of alloy in which at least one of Ir, Rh, Au, Ru, Re and $ZrO_2$ is added into Pt, alloy in which at least one of Pt, Rh, Ru and Re is added to Ir, or alloy in which at least one of Pt, Au, Ir, Ru and Re is added into Rh, wherein the material is different from the material composing the airtight mating face. Accordingly, it is possible to prevent the airtight mating face and the gasket member from sticking to each other with pressure while they are being used at high temperature and pressure.

The airtight mating face and one or both of the surfaces of the gasket member can be coated with material, which has high corrosion-resistance property and is difficult to be plastically deformed at the temperature 550° C. by the thickness 0.01 to 100 μm. For example, material having 0.2% proof stress of which is not less than 150 MPa may be used. By this coating, it is possible to prevent the airtight mating face and the gasket member from thermally sticking to each other. The coating can be made of Pt alloy, Ir, Ir alloy, Rh, Rh alloy, Au alloy, Ru, Ru alloy, Re, Ta, Ta alloy, Zr or Zr alloy. When the thickness of the coating is smaller than 0.01 μm, it is impossible to sufficiently obtain the above action. On the other hand, the thickness of the coating exceeds 100 μm, damage is caused by the internal stress. Therefore, the thickness is determined at 0.01 to 100 μm.

A small hole for deflating gas such as atmospheric air staying in a gap between the pressure vessel body and the corrosion-resistant lining is formed in the pressure vessel body, for example, in the bottom portion of the pressure vessel body. Concerning this small hole for deflating gas, after gas has been deflated, the corrosion-resistant mechanical lining is closely contacted with the pressure vessel and a top-shaped penetration preventing member is arranged between the pressure vessel body and the corrosion-resistant lining, so that the mechanical lining can be prevented from being damaged during the airtight test and during the use at high temperature and pressure. When the small hole for deflating gas, which is provided in the pressure vessel body, is used, gas staying in the gap between the mechanical lining and the pressure vessel body can be effectively removed. Therefore, the mechanical lining can be smoothly, closely contacted with the pressure vessel body. It is possible to avoid making a failure in making the mechanical lining tightly contact with the pressure vessel body. Therefore, when a hydraulic pressure test or a running test is conducted, it is possible to prevent damage of the mechanical lining caused in a portion in which a failure is made in making the mechanical lining closely contact with the pressure vessel body.

When a penetration preventing member is inserted into between the pressure vessel body, in which the small hole is formed, and the mechanical lining, it is possible to prevent the mechanical lining from penetrating the small hole and causing a break by penetration.

In the process of manufacturing the pressure vessel, before the internal cylindrical mechanical lining is inserted into the pressure vessel body, Pt, Au, Ag Cu or Ta, the elongation of which is very excellent, is coated on one or both of the inner wall of the pressure vessel body and the outer wall of the mechanical lining. Therefore, the mutual diffusion is conducted under the condition of high temperature and pressure, so that integration (cladding) can be made. Accordingly, the pressure vessel body and the mechanical lining can be excellently stuck to each other.

In order to detect that fluid of high pressure has leaked out into a gap formed between the pressure vessel body and the mechanical lining, a small hole capable of being opened and closed is provided in the bottom portion of the pressure vessel body. In this small hole, a sensor can be arranged which detects a composition of gas at the time of operation or at the time of rest.

In the pressure vessel of the present invention, it is possible to arrange an internal container in the pressure vessel. In addition to the mechanical lining made of corrosion-resistant alloy, the internal container made of corrosion-resistant alloy is used. Accordingly, impurities can be doubly prevented from being mixed into single crystals. Further, the single crystals of high quality can be stably manufactured.

In the structure in which the internal container is accommodated, solvent, the corrosion property of which is low, can be charged into a gap formed between the pressure vessel body and the internal container at a predetermined volume rate. Therefore, the pressure vessel can be prevented from being corroded.

The internal container can be made of Pt or Ir, or alternatively the internal container can be made of a combination of alloy in which at least one of Ir, Rh, Au, Ru, Re and $ZrO_2$ is added into Pt, alloy in which at least one of Pt, Rh, Ru and Re is added to Ir, or alloy in which at least one of Pt, Au, Ir, Ru and Re is added into Rh.

Into the internal container, solvent such as alkali aqueous solution or ammonia fluid, to which a strongly corrosive mineralizing agent is added, is charged at a predetermined volume ratio, and solvent such as water not containing the mineralizing agent, alkali aqueous solution or pure ammonia is charged into a gap formed between the pressure vessel body, on which lining has been formed, and the internal container at a predetermined volume ratio. A supercritical state is maintained in the internal container under the condition that the pressure inside the internal container and the pressure outside the internal container are balanced by heating with a heater arranged outside the pressure vessel.

Effects of the Invention

The present invention provides a pressure vessel for growing single crystals by the solvothermal method, wherein a pressure vessel body, in which a supercritical state is maintained, is made of heat resistant alloy, a portion of the pressure vessel body is open, a corrosion-resistant mechanical lining is provided on an inner face of the pressure vessel and on an entire outer circumferential edge of the opening, and the opening is sealed by a cover under the condition that the corrosion-resistant mechanical lining formed on the outer circumferential edge of the opening is used as an airtight mating face. Accordingly, the pressure vessel for growing single crystals of the present invention has an airtight sealing mechanism capable of being repeatedly opened and closed and it is possible to industrially manufacture single crystals of very high quality.

DESCRIPTION OF REFERENCE NUMERALS AND SIGNS

Figure 1:
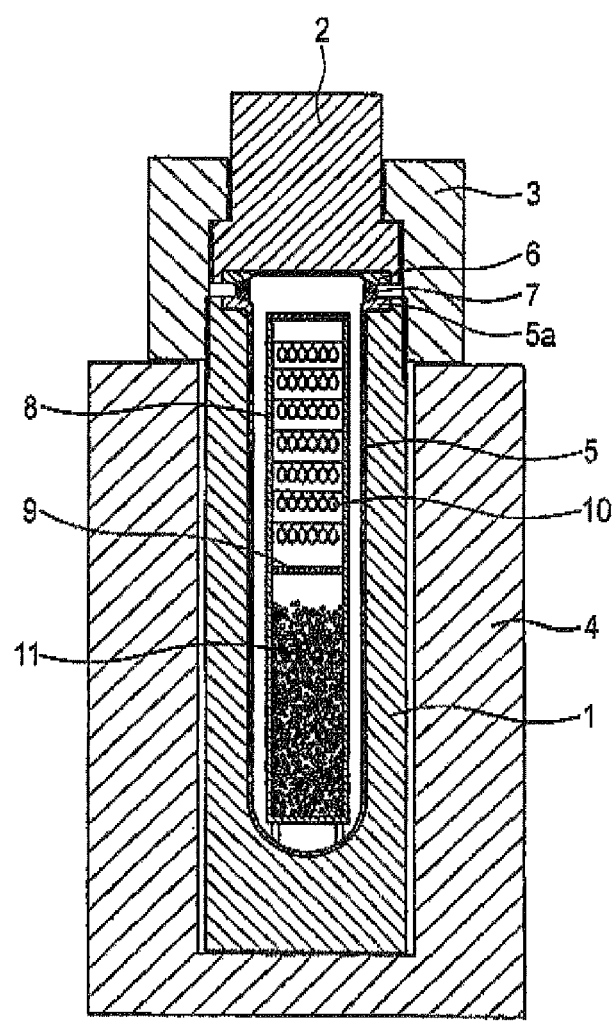
[FIG. 1] A sectional view showing a pressure vessel having an internal cylindrical container and a mechanical lining with a flange of an embodiment of the present invention.

1 Pressure vessel body
2 Cover
3 Box nut or clamp
4 Heater
5 Mechanical lining with flange
5a Flange portion
50 Mechanical lining body
51 Flange portion
52 Joining portion
6 Lining cover
7 Gasket
8 Internal cylindrical container
9 Convection control plate
10 Seed crystals
11 Raw material
12a Intermediate covering layer
12b Intermediate covering layer
17 Small hole
18 Joint pipe
19 O-ring
20 Penetration preventing member
21 Coating
22 Opening and closing valve
23 Gas detector

BEST MODE FOR CARRYING OUT THE INVENTION

An embodiment of the present invention will be explained as follows.

As shown in FIG. 1, a cylindrical pressure vessel body 1 having a bottom and a cover 2 are fixed to each other by a box nut or a clamp 3. These members are made of heat-resistant alloy such as low alloy steel or Ni—Cr alloy. The pressure vessel body 1 is heated by a heater 4 arranged in an outer circumferential portion of the pressure vessel body 1.

The inside of the pressure vessel body 1 is covered with a cylindrical mechanical lining 5 having a flange. The mechanical lining 5 having a flange includes a flange portion 5a, in which an airtight mating face is formed, and the flange portion 5a concerned covers an outer circumferential edge of the opening portion of the pressure vessel 1. On the inner face of the cover 2, a lining cover 6 is provided. The mechanical lining 5 and the lining cover 6 are made of corrosion-resistant material described before. Between the mechanical lining 5 and the lining cover 6, the aforementioned ring-shaped self-contraction gasket 7 made of suitable material is provided. The self-contraction gasket 7 is formed into a tapered shape in which the wall thickness is increased toward the inner circumferential side and decreased toward the outer circumferential side. It is suitable that the mechanical lining 5 and the lining cover 6 are made of material, the hardness of which is higher than that of the material of the gasket 7.

The flange portion 5a, the gasket 7 and the lining cover 6 compose an airtight sealing portion capable of being repeatedly opened and closed.

The mechanical lining 5 having a flange, the gasket 7 and the lining cover 6 are made of corrosion-resistant alloy such as Pt. Accordingly, all portions coming into contact with liquid including the airtight sealing portion are made of alloy having high corrosion-resistance. Accordingly, there is no possibility that the pressure vessel comes into contact with solvent such as a strongly corrosive alkali aqueous solution, an acid aqueous solution or a liquefied ammonia. Therefore, the pressure vessel is not corroded. Accordingly, no foreign objects to deteriorate the quality of single crystals are generated.

Further, an internal cylindrical container 8, which is an internal container, is accommodated inside the pressure vessel body 1. The internal cylindrical container 8 is made of alloy such as Pt having high corrosion-resistance. Single crystals are grown in the internal cylindrical container 8. The internal cylindrical container 8 accommodates solvent, a convection control plate 9, seed crystals 9 and raw material 11. Between the pressure vessel body 1 and the internal cylindrical container 8, a predetermined quantity of solvent is charged. Alkali aqueous solution, acid aqueous solution or ammonia liquid, to which a strongly corrosive mineralizing agent is added, are charged into the internal cylindrical container 8 at a predetermined volume ratio. Solvent is charged into a gap portion formed between the pressure vessel body 1 and the internal cylindrical container 8 at a predetermined volume ratio. However, water, alkali aqueous solution or pure ammonia, the corrosion property of which is relatively low, may be charged without adding the strongly corrosive mineralizing agent. This is effective to prevent the pressure vessel body 1 from being corroded.

In this embodiment, in addition to the mechanical lining 5 having a flange made of corrosive-resistant alloy, the internal cylindrical container 8 is used. Therefore, impurities can be doubly prevented from being mixed into single crystals. Further, single crystals of high quality can be stably manufactured. Incidentally, in the present invention, single crystals can be directly grown in the pressure vessel body 1, in which the mechanical lining 5 is arranged, without using the internal cylindrical container 8.

As shown in FIG. 1, the mechanical lining 5 having a flange arranged in the pressure vessel body 1 closely comes into contact with the pressure vessel body 1. When the pressure vessel body 1 is heated by the heater 4, the pressure vessel body 1 and the mechanical lining 5 having a flange are respectively expanded. They are mainly expanded in the axial direction of the pressure vessel. At this time, in the case where a coefficient of linear expansion of the pressure vessel body 1 is extremely higher than a coefficient of the mechanical lining 5 having a flange, an elongation of the pressure vessel body 1 can not follow an elongation of the mechanical lining 5 having a flange, and the mechanical lining 5 having a flange may be damaged. Therefore, the pressure vessel body 1 is made of heat-resistant material, the coefficient of linear expansion of which relatively coincides with the coefficient of linear expansion of corrosion-resistant alloy such as Pt composing the mechanical lining 5 having a flange. Specifically, it is suitable to use heat-resistant material in which the coefficient of linear expansion in the temperature region from the room temperature to 550° C. is restricted in the range from $5 \times 10^{-6}$ to $11 \times 10^{-6}$.

Figure 2:
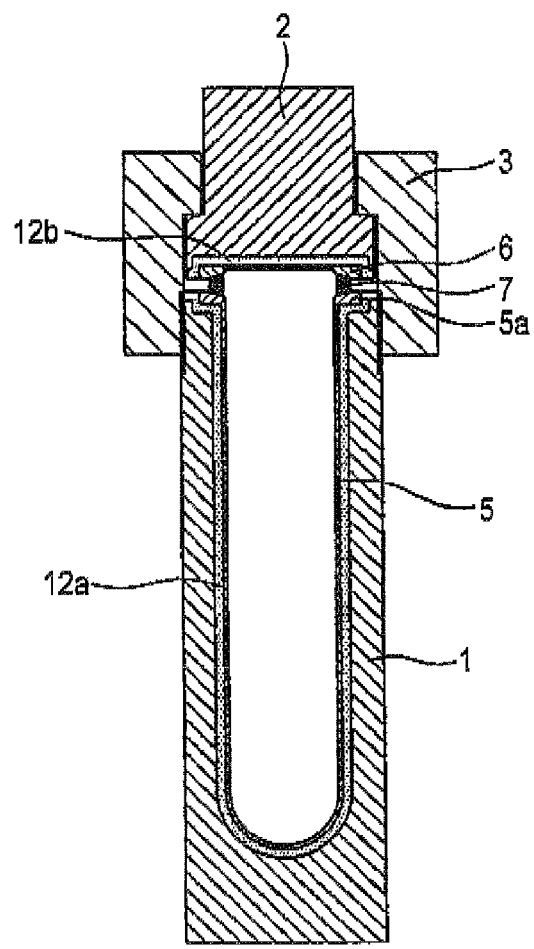
[FIG. 2] A sectional view showing a pressure vessel having an intermediate covering layer and a mechanical lining with a flange of an embodiment of the present invention.

Next, in the pressure vessel shown in FIG. 2, on the inner faces of the pressure vessel body 1 and the cover 2, intermediate covering layers 12a, 12b are formed by means of padding. The mechanical lining 5 having a flange is provided on the intermediate covering layer 12a. The lining cover 6 is provided on the intermediate covering layer 12b. Accordingly, the pressure vessel body 1 is composed of a three-layer structure. The intermediate covering layers 12a, 12b are made of Ni—Cr alloy or Ni—Cr—Mo alloy each having excellent corrosion-resistant property and the nitriding-resistant property. The intermediate layers 12a, 12b are mainly formed by the method of padding. The intermediate layers 12a, 12b cover inner faces of the pressure vessel body 1 and the cover 2 by the thickness of 1 to 30 mm. The covering method is not limited to the method of padding. However, the intermediate covering layer 12a is perfectly joined to the pressure vessel body 1 from the viewpoint of metallography in order to avoid formation of gaps and cracks on the intermediate covering layer 12a. In the case where the mechanical lining 5 having a flange is damaged and the strongly corrosive solvent flows outside the lining, the intermediate covering layer 12a prevents the pressure vessel body 1 from being corroded by the solvent. In the case where the intermediate covering layers 12a, 12b are arranged, it is unnecessary that the pressure vessel body 1 and the cover 2 are made of material having high corrosion-resistance. In many cases, heat-resistant alloys are not highly corrosion-resistant. However, when the intermediate covering layers 12a, 12b are provided, it becomes possible to use heat-resistant alloy, which has high mechanical strength at high temperature, without giving consideration to the corrosion-resistant property. Therefore, it become possible to provide a pressure vessel capable of obtaining an operating condition of high temperature and pressure suitable for manufacturing single crystals.

Figure 3:
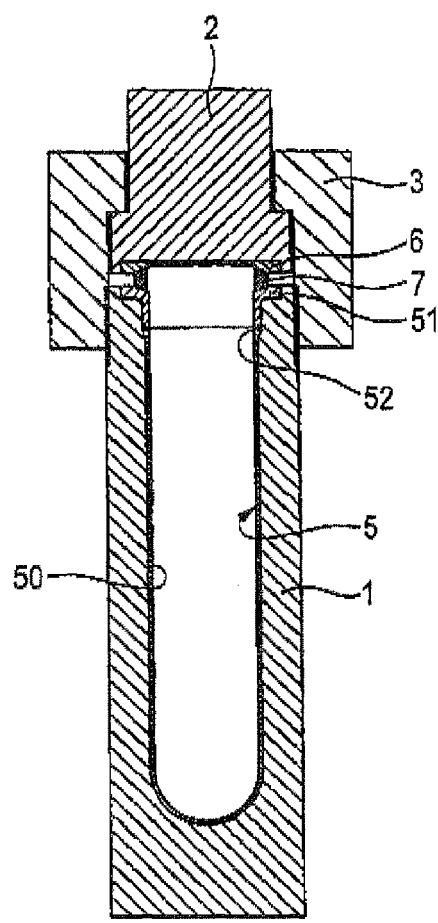
[FIG. 3] A sectional view showing a pressure vessel having a mechanical lining in which a flange portion and a mechanical lining body are joined to each other of an embodiment of the present invention.

Next, as shown in FIG. 3, the mechanical lining 5 having a flange is composed in such a manner that the mechanical lining body 50 and the flange portion 51 having an airtight sealing structure are joined to each other by the joining portion 52. The flange portion 51 is made of material such as Ir, which has high surface pressure strength and is difficult to be plastically deformed, so that the seat face can be prevented from being deformed during the use and the flange portion 51 can be repeatedly used. On the other hand, the mechanical lining body 50 is made of material such as Pt having high ductility so as to prevent the occurrence of damage caused by a difference in the coefficient of linear expansion between the mechanical lining body 50 and the pressure vessel body 1. The flange portion 51 and the mechanical lining body 50 are joined to each other by the method of welding. It is desirable to use the method of welding. However, as long as it is possible to obtain a perfect metallic joint, any joining method can be employed.

The joining portion 52, in which the mechanical lining body 50 and the flange portion 51 are joined to each other, is located at a position and formed into a shape so that stress concentration, which becomes a starting point of corrosion and fatigue, is not caused.

Figure 4:
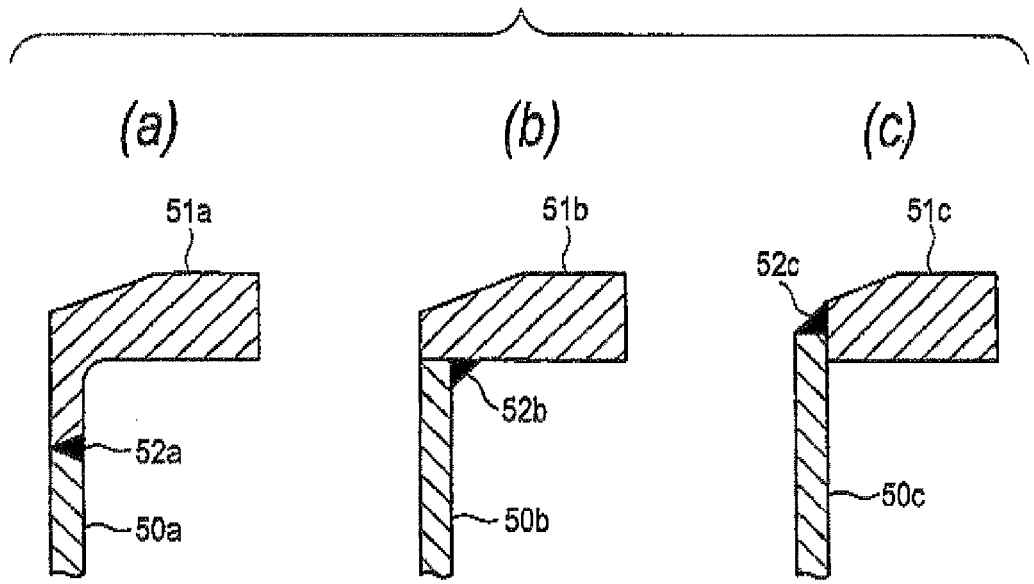
[FIG. 4] A partial enlarged view showing a variation of a joining position at which a flange portion and a mechanical lining body are joined to each other of an embodiment of the present invention.

FIG. 4 is a view showing an example of the joining position at which the flange portion and the mechanical lining body are joined to each other.

As shown in FIG. 4(*a*), it is suitable that the flange portion 51a is composed as follows. The flange portion 51a is formed into an integrated body, the cross section of which is an L-shape, including a portion of the cylindrical shape of the mechanical lining body 50a, and the cylindrical portions are butted and joined to each other at the joining portion 52a. It is not desirable to employ the following structure shown in FIGS. 4(*b*) and 4(*c*). In FIGS. 4(*b*) and 4(*c*), the ring-shaped members of the flange portions 51b, 51c and the mechanical lining bodies 50b, 50c are directly connected to each other. In this structure, the joining portions 52b, 52c are located at the corner portions in which stress concentration tends to occur. Further, in the structure in which the joining portions 52b, 52c are located close to the ring-shaped member, in the process of the post-heating, the ring-shaped member is influenced by heat and deformed. Accordingly, it is desirable that the joining portion is located at a position a little distant from the corner portion. Further, it is desirable that the joining portion is located at a position where the ring-shaped member is not influenced by the heat of the post-heating treatment.

Figure 5:
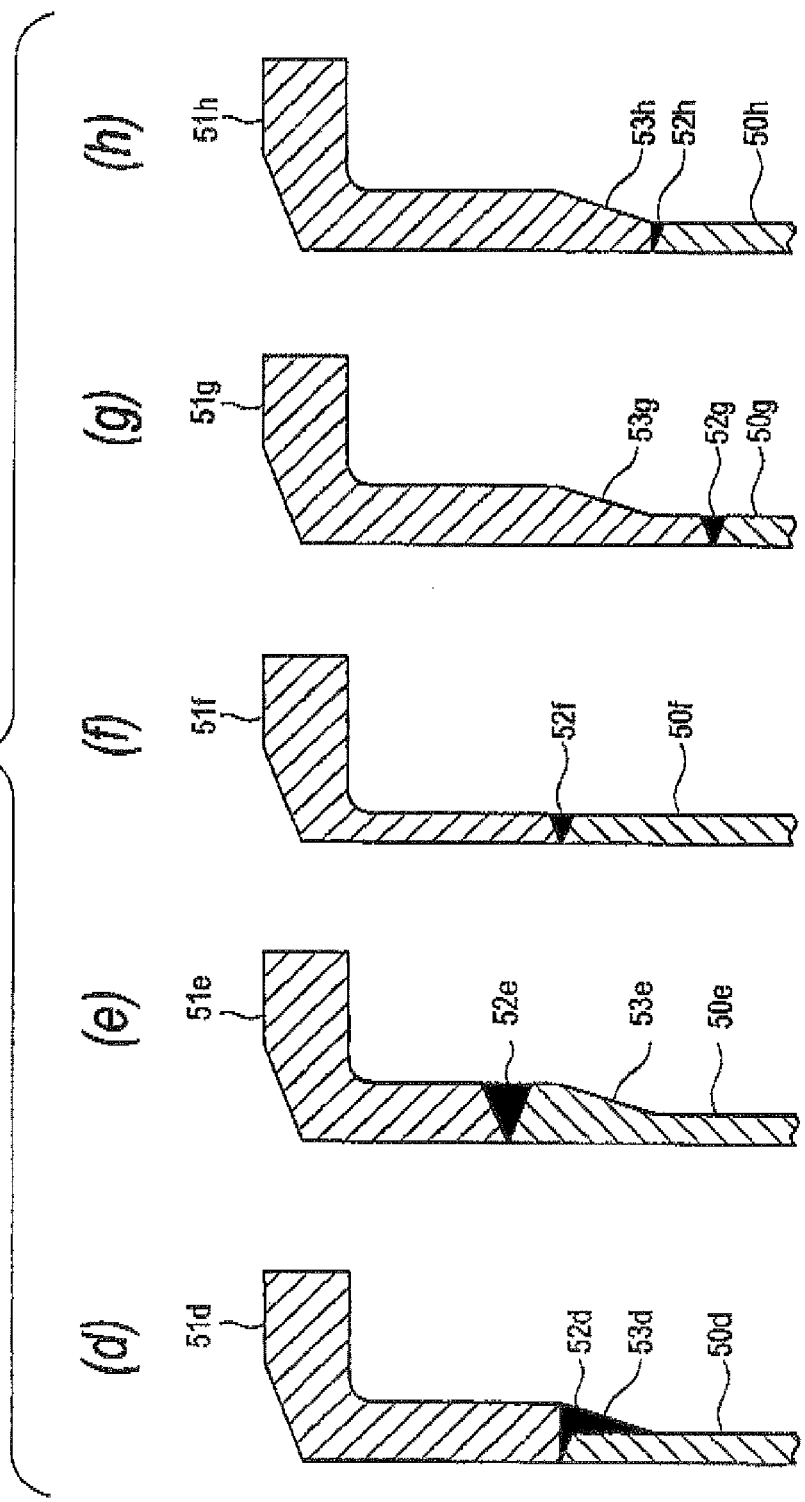
[FIG. 5] A partial enlarged view showing a variation of a shape of a joining portion at which a flange portion and a mechanical lining body are joined to each other of an embodiment of the present invention.

Further, in FIG. 5, a shape of the joining portion, in which the flange portion and the mechanical lining body are joined to each other, is shown.

Since a coefficient of linear expansion of the mechanical lining body is lower than a coefficient of linear expansion of the pressure vessel, there is a possibility that repeated stress is generated in the joining portion and the mechanical lining body is damaged. Therefore, as shown in FIGS. 5(*d*) and 5(*e*), the wall thickness of the barrel portion of the flange portion 51d, 5/e is increased larger than the wall thickness of the mechanical lining body 50d, 50e and a tapered step portion is provided. Positions of the joining portions 52d, 52e are located on the thick side of the tapered portion 53d as shown in FIG. 5(d) or on the thick side of the tapered portion 53e as shown in FIG. 5(e). According to the above structure, the mechanical strength of the joining portion can be ensured. Further, the same tapered portion is formed in the pressure vessel body 1. Expansion and contraction at the time of the use are mainly caused by the mechanical lining body. Since the tapered portion is provided, expansion and contraction are caused only on the mechanical lining body side on the lower side of the tapered portion. Accordingly, it is possible to suppress expansion and contraction on the flange side on which the joining portion is arranged.

On the other hand, as shown in FIG. 5(f), in the structure having no tapered portion although the wall thickness of the flange portion 51f is large, stress concentration is caused by expansion and contraction of the mechanical lining body 50f at the joining portion 52f. Therefore, this structure is not appropriate. Even if the tapered portions 53h, 53h are provided as shown in FIGS. 5(g) and 5(h), when the joining portions 52g, 52h are arranged on the mechanical lining body 50g, 50h side, this structure is not appropriate because stress concentration is generated in the joining portions 52g, 52h.

Concerning the structural portion of the seal of the pressure vessel, airtight seat faces of the mechanical lining 5 having a flange and the lining cover 6 are made of material, the hardness of which is higher than the hardness of the gasket 7. The reason is that each member can be repeatedly used when the airtight seat face is prevented from being deformed and the gasket member 7 is periodically replaced.

In order to prevent the gasket member 7 from thermally sticking onto the seat face during the use at high temperature and pressure, the gasket member 7 is made of different alloy from the alloy of the seat face. Since single crystals are grown under the condition of a super high pressure of not less 100 MPa, a self-contraction type gasket structure is appropriately used for the sealing portion. When the seat face and the front surface of the gasket 7 are coated with material, which has high corrosion-resistant property and is difficult to be plastically deformed, the seat face and the gasket 7 are prevented from thermally sticking to each other. Therefore, the seat face and the gasket 7 can be repeatedly used. Concerning the coating method, vapor-deposition is used. However, the coating method is not limited to vapor-deposition. Any method may be used.

In the case where the mechanical lining 5 having a flange is incorporated into the pressure vessel body 1, it is important to make the mechanical lining 5 contact with the pressure vessel body 1 completely. In the case where the mechanical lining 5 is incompletely contacted with the pressure vessel body 1, the mechanical lining 5 tends to be damaged at the portion of the incomplete contact because stress concentration is caused. In order to make the mechanical lining 5 contact with the pressure vessel body 1 completely, it is important to remove gas staying between both members.

Figure 6:
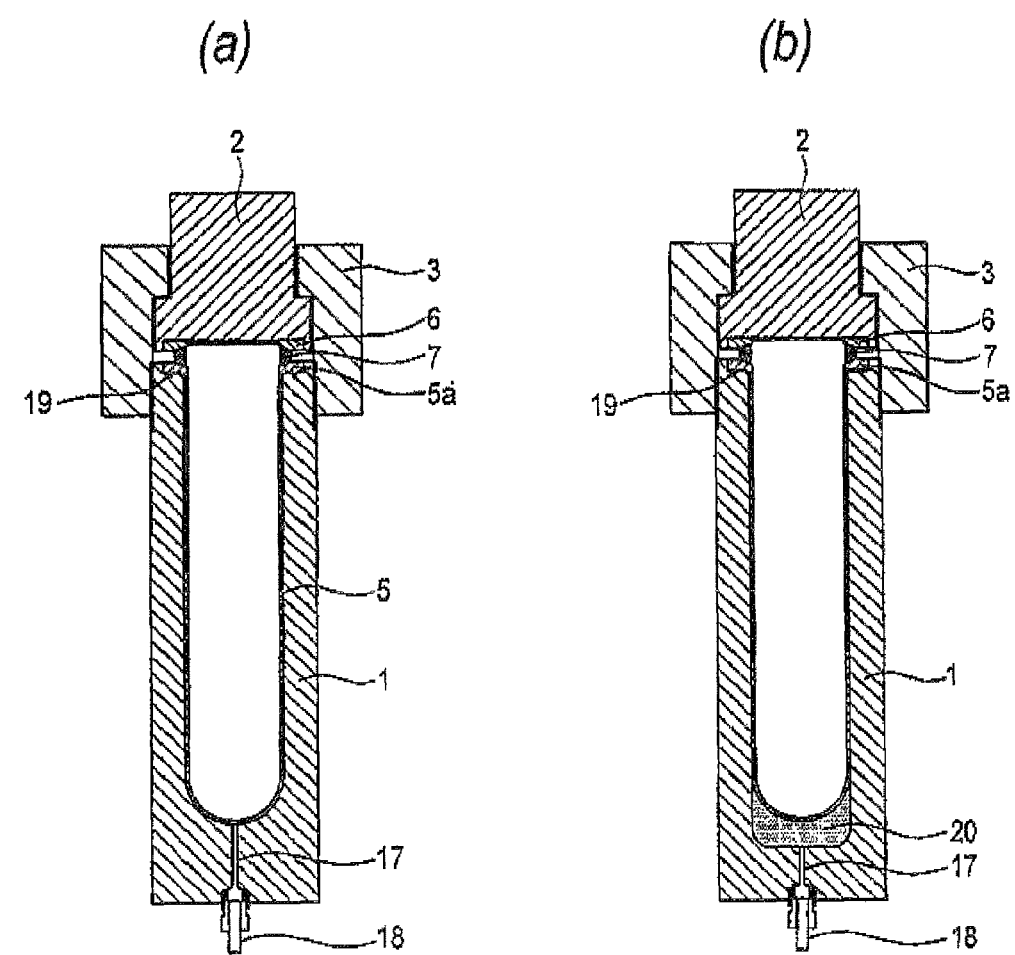
[FIG. 6] A sectional view for explaining a closely contacting method in which a mechanical lining with a flange and a pressure vessel body are closely contacted to each other of an embodiment of the present invention.

FIG. 6 shows a method of making the pressure vessel body 1 contact with the mechanical lining 5 having a flange closely. In the contact portion of the flange portion 5a of the mechanical lining 5 having a flange with the pressure vessel body 1, O-ring is arranged. Further, in a bottom portion of the pressure vessel body 1, a small hole 17 is formed. Into the small hole 17, a joint pipe 18 is attached and connected to a vacuum exhausting device not shown. A procedure of making the pressure vessel body 1 closely contact with the mechanical lining 5 having a flange is described as follows. First, gas staying in a gap formed between the pressure vessel body 1 and the mechanical lining 5 having a flange is removed by the vacuum exhausting device. Next, the cover 2 is closed, and the inside of the pressure vessel body 1 is maintained in an airtight state. After that, while the pressure in the pressure vessel body 1 is being grown by an intensifier arranged outside and the mechanical lining 5 having a flange is being plastically deformed, the mechanical lining 5 having a flange is made to closely contact with the pressure vessel body 1. After the mechanical lining 5 having a flange has been made to closely contact with the pressure vessel body 1, the joint pipe 18 attached to the small hole 17 is detached and a sealing plug is attached to the small hole 17.

There is a possibility that the mechanical lining 5 having a flange penetrates the small hole 17 formed in the bottom portion of the pressure vessel body 1 as shown in FIG. 6(a) and is damaged by the penetration during the use. Therefore, as shown in FIG. 6(b), a top-shaped penetration preventing member 20 is previously arranged in the bottom portion of the pressure vessel body 1 in which the small hole 17 is formed. By the arranged penetration preventing member 20, the penetration destruction of the mechanical lining 5 can be prevented. A shape and size of the penetration preventing member 20 are not particularly restricted by the specific example as long as no sharp angles are formed and an inner face of the mechanical lining 5 having a flange is formed into a continuous shape.

Figure 7:
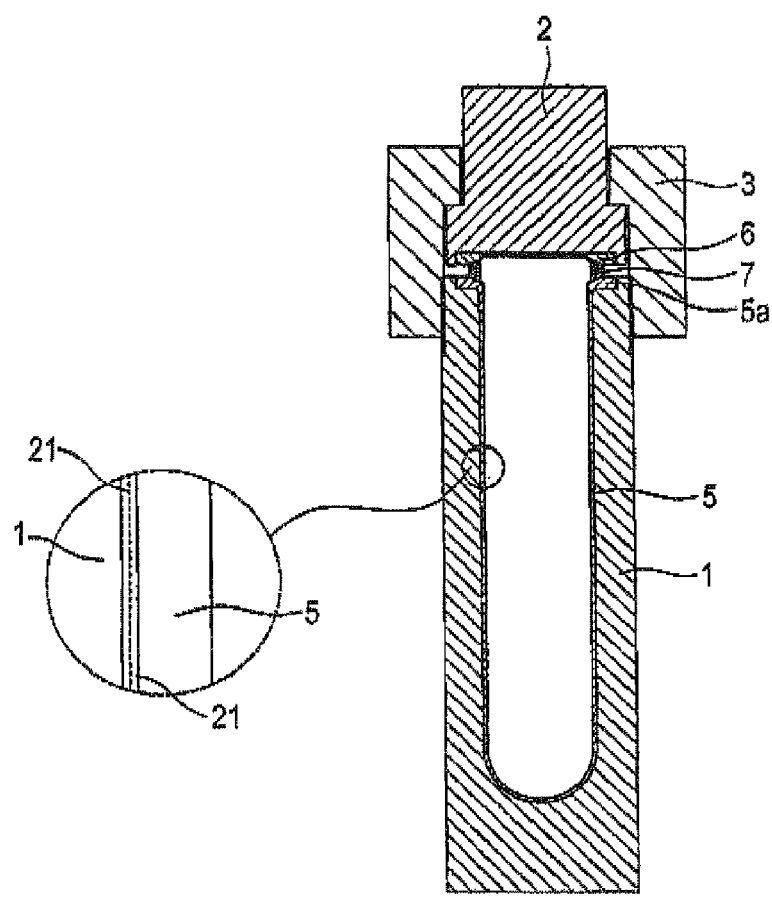
[FIG. 7] A sectional view showing a pressure vessel in which a highly ductile member is arranged between a mechanical lining with a flange and a pressure vessel body of an embodiment of the present invention.

In order to make the pressure vessel body 1 more closely contact with the mechanical lining 5 having a flange, as shown in FIG. 7, the contact face is covered with the coating 21 of highly ductile material such as Pt having excellent elongation. In this way, both are made to closely come into contact with each other and the mechanical lining can be prevented from being damaged. Coatings 21, 21 respectively provided on the pressure vessel body 1 and the mechanical lining 5 having a flange are clad and integrated with each other in a state of high temperature and pressure. Incidentally, it is possible to form the coating 21 only on one side of the pressure vessel body 1 and the mechanical lining 5 having a flange. However, in order to conduct cladding smoothly, it is desirable to form the coatings 21 only on both sides of the pressure vessel body 1 and the mechanical lining 5 having a flange.

Figure 8:
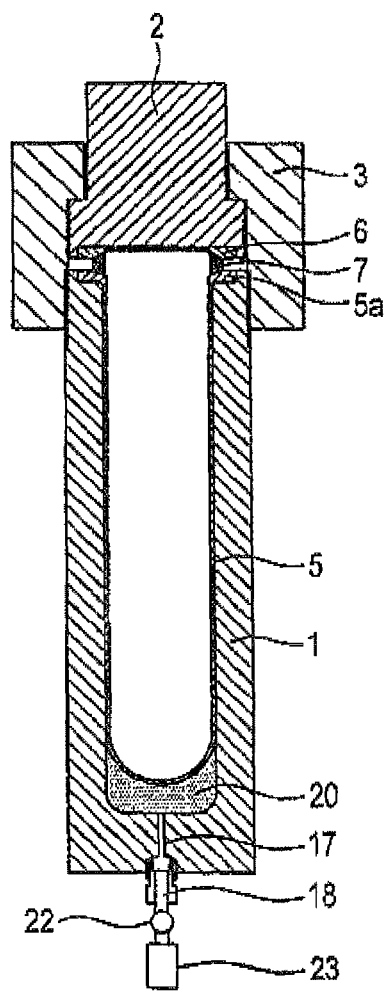
[FIG. 8] A sectional view showing an example of a mechanical lining with a flange and a pressure vessel in which gas can be detected.
Figure 9:
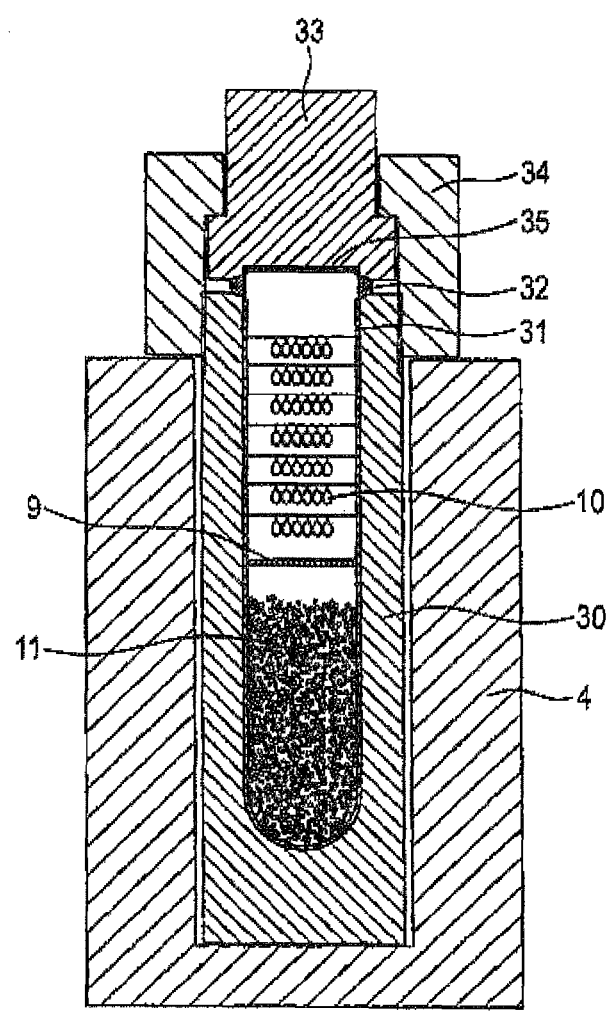
[FIG. 9] A sectional view showing an example of a related pressure vessel for growing single crystals.
Figure 10:
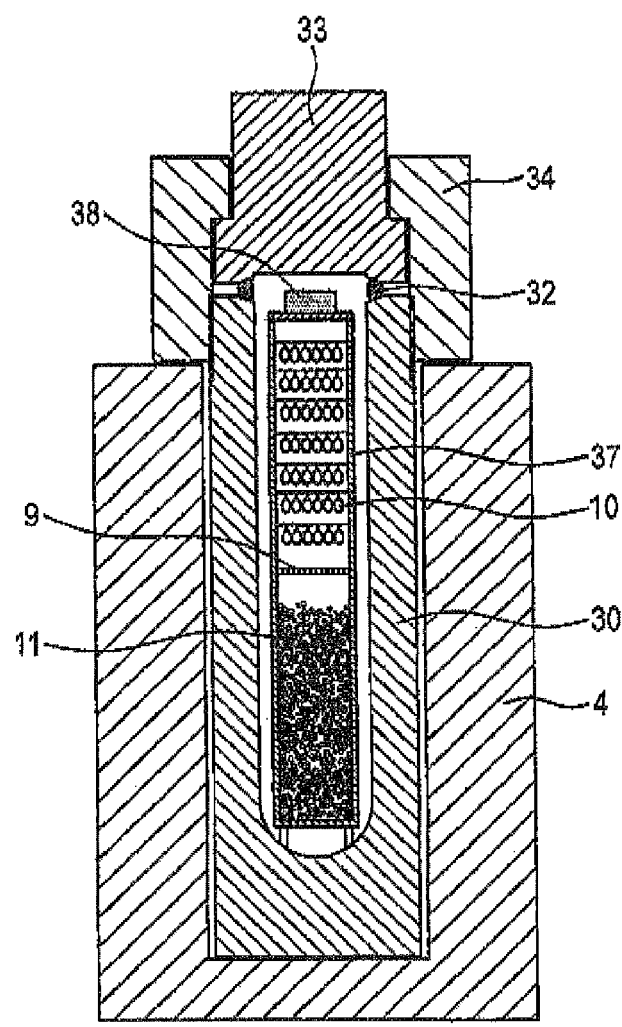
[FIG. 10] A sectional view showing another example of a related pressure vessel for growing single crystals.

Incidentally, when inner fluid leaks out due to damage caused on the mechanical lining 5 having a flange, it is necessary to quickly find the leakage of fluid and take countermeasures to keep safety. Therefore, as shown in FIG. 8, the small hole 17 is provided in the bottom portion of the pressure vessel body 1 and the detector 23 for detecting a gas composition is attached through the opening and closing valve 22. The detector 23 can detect a leakage of gas not only when the device is used in a state of high pressure but also when operation of the device is stopped and no pressure is given to the device. Incidentally, concerning the detector 23, the pressure detector may be used together with the gas detector.

The present invention has been explained in detail above referring to the specific embodiments. However, it is clear that variations can be made by those skilled in the art without departing from the spirit and scope of the present invention.

The present application is based on the Japanese Patent Application (No. 2005-004998) filed on Jan. 12, 2005. The contents of the application is taken in here so as to be used as reference.

INDUSTRIAL APPLICABILITY

The present invention provides a pressure vessel for growing single crystals by the solvothermal method, wherein a pressure vessel body, in which a supercritical state is maintained, is made of heat resistant alloy, a portion of the pressure vessel body is open, a corrosion-resistant mechanical lining is provided on an inner face of the pressure vessel and on an entire outer circumferential edge of the opening, and the opening is sealed by a cover under the condition that the corrosion-resistant mechanical lining formed on the outer circumferential edge of the opening is used as an airtight mating face to seal airtightly. Therefore, the pressure vessel for growing single crystals includes an airtight sealing mechanism capable of being repeatedly opened and closed and being used for industrially manufacturing single crystals of very high purity.

The invention claimed is:

1. A pressure vessel for growing single crystals by solvothermal method, the pressure vessel comprising:
a pressure vessel body made of a heat-resistant alloy for maintaining a supercritical state, the pressure vessel body including an opening;
a corrosion-resistant mechanical lining provided on an inner face of the pressure vessel body and on an entire outer circumferential edge of the opening; and
a cover for sealing the opening under a condition that the corrosion-resistant mechanical lining formed on the outer circumferential edge of the opening is used as an airtight mating face,
wherein the corrosion-resistant mechanical lining is composed by joining the corrosion-resistant mechanical lining formed on the outer circumferential edge of the opening and the corrosion-resistant mechanical lining formed on the inner face of the pressure vessel body, a joining portion of which being distant from a corner portion of the corrosion-resistant mechanical lining, wherein:
the joining portion is located on the inner face of the pressure vessel body;
the corrosion-resistant mechanical lining includes a first portion formed on the inner face of the pressure vessel body having a first wall thickness and a second portion formed on the inner face of the pressure vessel body having a second wall thickness;
the first wall thickness is greater than the second wall thickness; and
the first portion is closer to the opening of the pressure vessel body than the second portion.

2. The pressure vessel for growing single crystals according to claim 1,
wherein the pressure vessel body is made of one of heat-resistant alloys of Fe alloy, Ni alloy, Cr alloy, Mo alloy and Co alloy.

3. The pressure vessel for growing single crystals according to claim 1,
wherein the corrosion-resistant mechanical lining is made of Pt or Ir, alloy in which at least one of Ir, Rh, Au, Ru, Re and $ZrO_2$ is added into Pt, alloy in which at least one of Pt, Rh, Ru and Re is added to Ir, alloy in which at least one of Pt, Au, Ir, Ru and Re is added into Rh, or a combination thereof,
wherein the pressure vessel further comprises a self-contraction gasket member interposed between the airtight mating face and the cover,
wherein the self-contraction gasket member is made of Pt or Ir, alloy in which at least one of Ir, Rh, Au, Ru, Re and $ZrO_2$ is added into Pt, alloy in which at least one of Pt, Rh, Ru and Re is added to Ir, or alloy in which at least one of Pt, Ir, Au, Ru and Re is added into Rh, and wherein the self-contraction gasket member is made of a material different from a material composing the airtight mating face.

4. The pressure vessel for growing single crystals according to claim 1,
wherein an intermediate covering layer is formed as an inner layer of the corrosion-resistant mechanical lining on an inner face of the pressure vessel body by a wall thickness in the range from 1 to 30 mm, and the intermediate covering layer is nitriding resistant and corrosion resistant.

5. The pressure vessel for growing single crystals according to claim 4,
wherein the intermediate coating layer is made of corrosion-resistant alloy of one of Fe alloy, Ni alloy, Cr alloy, Mo alloy and Co alloy.

6. The pressure vessel for growing single crystals according to claim 4,
wherein the intermediate coating layer is made of corrosion-resistant alloy of one of Ni—Cr alloy and Ni—Cr—Mo alloy.

7. The pressure vessel for growing single crystals according to claim 1,
wherein the corrosion-resistant mechanical lining is composed by joining the corrosionresistant mechanical lining formed on the outer circumferential edge of the opening and the corrosion-resistant mechanical lining formed on the inner face of the pressure vessel body by means of welding, and
wherein the joining portion is located at a position such that an outer circumferential edge of the pressure vessel body is prevented from being influenced by heat of a post-heating treatment to the joining portion.

8. The pressure vessel for growing single crystals according to claim 1,
wherein the corrosion-resistant mechanical lining formed on the outer circumferential edge of the opening is made of Pt or Ir, alloy in which at least one of Ir, Rh, Au, Ru, Re and $ZrO_2$ is added into Pt, alloy in which at least one of Pt, Rh, Ru and Re is added to Ir, or alloy in which at least one of Pt, Au, Ir, Ru and Re is added into Rh, and
wherein the corrosion-resistant mechanical lining formed on the inner face of the pressure vessel is made of Pt or Ir, alloy in which at least one of Ir, Rh, Au, Ru, Re and $ZrO_2$ is added into Pt, alloy in which at least one of Pt, Rh, Ru and Re is added to Ir, or alloy in which at least one of Pt, Au, Ir, Ru and Re is added into Rh.

9. The pressure vessel for growing single crystals according to claim 1,
wherein a wall thickness of the corrosion-resistant mechanical lining formed on the outer circumferential edge of the opening is larger than that of the corrosion-resistant mechanical lining formed on the inner face of the pressure vessel body, and
wherein a tapered portion, in which the wall thickness is changed, is provided in the joining portion or provided in a periphery on a bottom side of the joining portion.

10. The pressure vessel for growing single crystals according to claim 1, further comprising a gasket member interposed between the airtight mating face and the cover,
wherein the corrosion-resistant mechanical lining composing the airtight mating face is made of a material harder than that of the gasket member.

11. The pressure vessel for growing single crystals according to claim 1,
wherein the airtight mating face and one or both of the surfaces of the gasket member are coated with a layer of material, which has high corrosion-resistance property and 0.2% proof stress at temperature 550° C. of which is not less than 150 MPa, by the thickness 0.01 to 100 μm.

12. The pressure vessel for growing single crystals according to claim 11,
wherein a material of the coating is one of Pt alloy, Ir, Ir alloy, Rh, Rh alloy, Au alloy, Ru, Ru alloy, Re, Ta, Ta alloy, Zr and Zr alloy.

13. The pressure vessel for growing single crystals according to claim 1,
wherein the pressure vessel body includes a small hole for deflating gas staying between the pressure vessel body and the corrosion-resistant mechanical lining, and
wherein the pressure vessel further comprises a penetration preventing member arranged between the pressure vessel body and the corrosion-resistant mechanical lining.

14. The pressure vessel for growing single crystals according to claim 1,
wherein the pressure vessel body includes a small hole capable of being opened and closed is provided in the pressure vessel body, and
wherein the small hole includes a sensor for detecting a composition of gas staying in a gap between the pressure vessel body and the corrosion-resistant mechanical lining.

15. The pressure vessel for growing single crystals according to claim 1, wherein:
the pressure vessel includes an internal container,
solvent including alkali aqueous solution or ammonia fluid, to which a corrosive mineralizing agent is added, is charged into the internal container,
solvent including water not containing the mineralizing agent, alkali aqueous solution or pure ammonia is charged into a gap formed between the outside of the internal container and the corrosion-resistant mechanical lining, and
the supercritical state is maintained in the internal container under the condition that a pressure inside the internal container and a pressure outside the internal container are balanced by heating.

16. The pressure vessel for growing single crystals according to claim 15,
wherein the internal container is made of Pt or Ir, alloy in which at least one of Ir, Rh, Au, Ru, Re and $ZrO_2$ is added into Pt, alloy in which at least one of Pt, Rh, Ru and Re is added to Ir, alloy in which at least one of Pt, Au, Ir, Ru and Re is added into Rh, or a combination thereof.

17. The pressure vessel for growing single crystals according to claim 1,
wherein coefficients of linear expansion of the heat-resistant alloy and the corrosion resistant-mechanical lining in a temperature region from a room temperature to 550° C. are in a range of $5 \times 10^{-6}$ to $11 \times 10^{-6}$ m/m° C.

18. The pressure vessel for growing single crystals according to claim 1,
wherein a tapered step portion is provided between the first portion and the second portion.

19. The pressure vessel for growing single crystals according to claim 18,
wherein the joining portion is located on the tapered step portion.

20. The pressure vessel for growing single crystals according to claim 1,
wherein the joining portion is located on the first portion.

* * * * *